US010904370B1

(12) United States Patent
Fournier et al.

(10) Patent No.: US 10,904,370 B1
(45) Date of Patent: Jan. 26, 2021

(54) HANDHELD ELECTRONIC DEVICE

(71) Applicant: Apple Inc., Cupertino, CA (US)

(72) Inventors: Douglas G. Fournier, Cupertino, CA (US); Kurtis Mundell, Cupertino, CA (US); Shayan Malek, San Jose, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/827,655

(22) Filed: Mar. 23, 2020

Related U.S. Application Data

(60) Provisional application No. 62/936,356, filed on Nov. 15, 2019, provisional application No. 62/986,580, filed on Mar. 6, 2020.

(51) Int. Cl.
| | |
|---|---|
| *H04M 1/02* | (2006.01) |
| *H01H 13/14* | (2006.01) |
| *H05K 5/00* | (2006.01) |
| *H05K 1/02* | (2006.01) |
| *G06F 3/041* | (2006.01) |

(52) U.S. Cl.
CPC ........ *H04M 1/0266* (2013.01); *G06F 3/0412* (2013.01); *H05K 1/0277* (2013.01); *H05K 2201/10128* (2013.01); *H05K 2201/10151* (2013.01)

(58) Field of Classification Search
CPC ...... H04M 1/02; H04M 1/026; H04M 1/0266; H04M 1/0277; H04M 1/23; H01H 13/14; H01H 13/50; H05K 5/00; H05K 5/0017; H05K 5/0026
See application file for complete search history.

(56) References Cited

U.S. PATENT DOCUMENTS

| | | | | |
|---|---|---|---|---|
| 8,786,548 | B2* | 7/2014 | Oh | H04M 1/233 345/160 |
| 9,697,409 | B2* | 7/2017 | Myers | G06K 9/0002 |
| 2009/0272639 | A1* | 11/2009 | Mittleman | H04M 1/23 200/345 |
| 2016/0004899 | A1* | 1/2016 | Pi | G06K 9/0002 345/173 |
| 2019/0208043 | A1* | 7/2019 | Cha | H04M 1/02 |

* cited by examiner

*Primary Examiner* — Blane J Jackson
(74) *Attorney, Agent, or Firm* — Brownstein Hyatt Farber Schreck, LLP

(57) ABSTRACT

A mobile phone may include a housing defining at least a portion of a back exterior surface of the mobile phone, a display stack at least partially within the housing, the display stack defining an active region configured to produce a graphical output, and a transparent cover positioned over the display stack. The transparent cover may define a first portion covering the active region of the display stack, a second portion adjacent the first portion, and a hole in the second portion and extending through the transparent cover. The mobile phone may also include a button element positioned in the hole of the transparent cover, a force-sensing system configured to detect an input applied to the button element, a circuit board coupled to the force-sensing system, and a shim positioned below the first portion of the transparent cover and having same thickness that as the circuit board.

20 Claims, 11 Drawing Sheets

HANDHELD ELECTRONIC DEVICE

CROSS-REFERENCE TO RELATED APPLICATIONS

This application is a nonprovisional patent application of and claims the benefit of U.S. Provisional Patent Application No. 62/936,356, Nov. 15, 2019 and titled "Handheld Electronic Device," and U.S. Provisional Patent Application No. 62/986,580, filed Mar. 6, 2020 and titled "Handheld Electronic Device," the disclosures of which are hereby incorporated herein by reference in their entireties.

FIELD

The subject matter of this disclosure relates generally to handheld electronic devices, and more particularly, to mobile phones.

BACKGROUND

Modern consumer electronic devices take many shapes and forms, and have numerous uses and functions. Smartphones, for example, provide various ways for users to interact with other people, as well as to access information, work, play games, and so forth. Such devices may include numerous systems to facilitate such interactions. For example, a smartphone may include a touch-sensitive display for providing graphical outputs and for accepting touch inputs, wireless communications systems for connecting with other devices to send and receive voice and data content, cameras for capturing photographs and videos, and so forth.

SUMMARY

A mobile phone may include a housing defining at least a portion of a back exterior surface of the mobile phone, a display stack at least partially within the housing, the display stack defining an active region configured to produce a graphical output, and a transparent cover positioned over the display stack. The transparent cover may define a first portion covering the active region of the display stack, a second portion adjacent the first portion, and a hole in the second portion and extending through the transparent cover. The mobile phone may also include a button element positioned in the hole of the transparent cover, a force-sensing system configured to detect an input applied to the button element, a circuit board coupled to the force-sensing system and positioned below the second portion of the transparent cover and having a first thickness, and a shim positioned below the first portion of the transparent cover and having a second thickness that is the same as the first thickness. The circuit board may include a first dielectric material, the shim may include a second dielectric material, and the first and second dielectric materials may be a same dielectric material.

The shim may define a first top surface and a first bottom surface opposite the first top surface, and the circuit board may define a second top surface a second bottom surface opposite the second top surface. The first top surface may be coplanar with the second top surface. The first top surface and the second top surface may both be coupled to a bottom surface of the display stack. The shim may define a first side surface extending from the first top surface to the first bottom surface, the circuit board may define a second side surface extending from the second top surface to the second bottom surface, and the first side surface may be adjacent to the second side surface. The first bottom surface and the second bottom surface may both be in contact with an upper surface of a component positioned below the circuit board and the shim. The component may be a metal frame member.

A mobile phone may include a housing defining at least a portion of a back exterior surface of the mobile phone, a display stack at least partially within the housing, and a transparent cover covering the display stack. The transparent cover may define a display region of the mobile phone, a border region along a side of the display region, and a hole in the border region and extending through the transparent cover. The mobile phone may further include a button element positioned in the hole of the transparent cover, and a circuit board positioned below the border region of the transparent cover and defining a first top surface in contact with a first component of the mobile phone and a first bottom surface in contact with a second component of the mobile phone. The mobile phone may further include a shim positioned below the display region of the transparent cover and defining a second top surface in contact with the first component of the mobile phone and a second bottom surface in contact with the second component of the mobile phone. The first component of the mobile phone may be a component of the display stack. The second component of the mobile phone may be a metal frame member.

The shim may have a same thickness as the circuit board. The mobile phone may further include a force sensing system configured to detect an input applied to the button element, and the circuit board may conductively couple the force sensing system to a processor of the mobile phone. The circuit board may include a set of conductive traces, and the shim may include a dielectric material that is substantially free of conductive traces. The circuit board and the shim may both comprise a flexible polymer material.

A handheld electronic device may include a housing defining at least a portion of a back exterior surface of the handheld electronic device, a display stack within the handheld electronic device, a transparent cover covering the display stack and defining a hole extending through the transparent cover, a button element positioned in the hole of the transparent cover, a frame member positioned below the display stack, a circuit board positioned below the hole and defining a first top surface coupled to the display stack and a first bottom surface coupled to the frame member, and a shim defining a second top surface coupled to the display stack and a second bottom surface coupled to the frame member. The shim may have a same thickness as the circuit board.

The shim may be conductively isolated from electrical components of the handheld electronic device. The frame member may include a metal. The handheld electronic device may further include a force sensing system configured to detect an input applied to the button element, and the circuit board may conductively couple the force sensing system to a processor of the handheld electronic device. The circuit board may include a flexible substrate, and the shim may be formed from a polyethylene terephthalate.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

Mobile phones as described herein may include complex, sophisticated components and systems that facilitate a multitude of functions. For example, mobile phones according to the instant disclosure may include touch- and/or force-sensitive displays, numerous cameras (including both front- and rear-facing cameras), GPS systems, haptic actuators, wireless charging systems, and all requisite computing components and software to operate these (and other) systems and otherwise provide the functionality of the mobile phones.

Figure 1A:
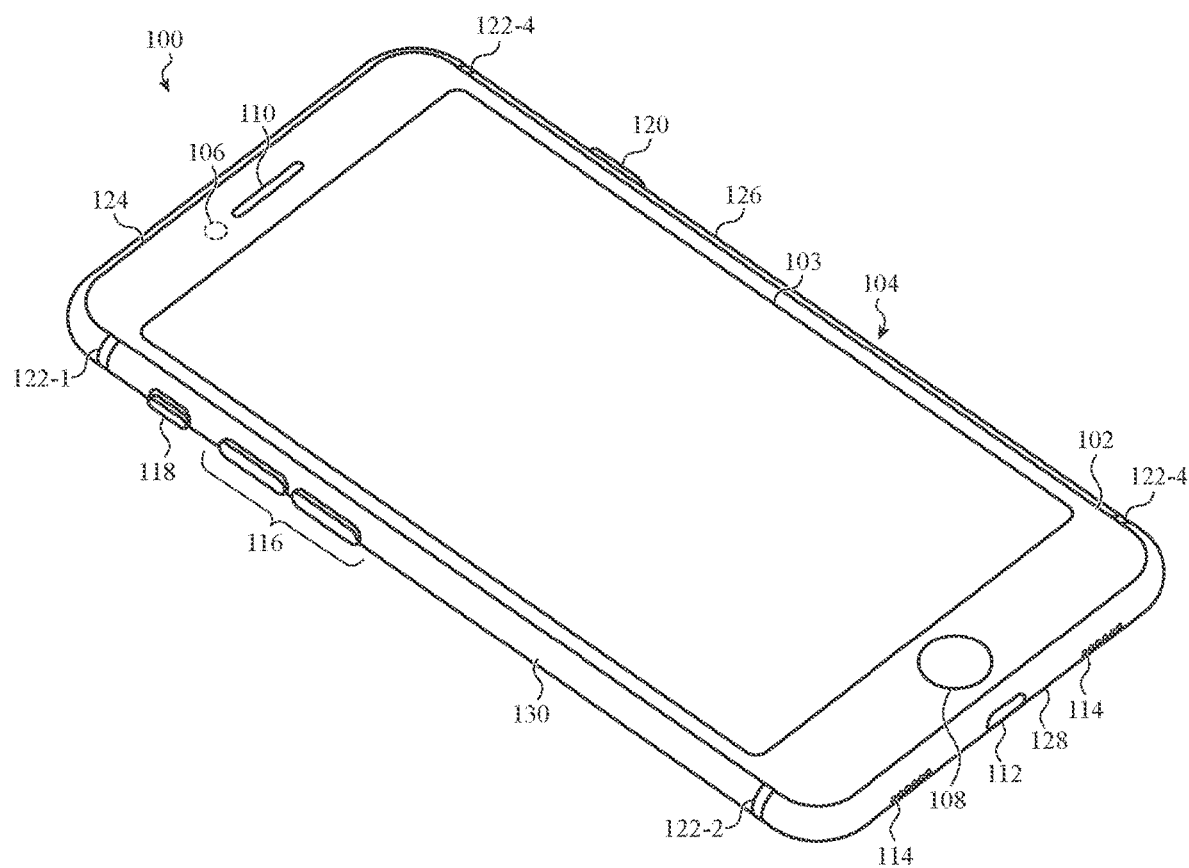
FIGS. 1A-1B depict an example electronic device.

FIG. 1A shows an example electronic device 100 embodied as a mobile phone. While the device 100 is a mobile phone, the concepts presented herein may apply to any appropriate electronic, including wearable devices (e.g., watches), laptop computers, handheld gaming devices, tablet computers, computing peripherals (e.g., mice, touchpads, keyboards), or any other device. Accordingly, any reference to an "electronic device" encompasses any and all of the foregoing.

The electronic device 100 includes a cover 102 (e.g., a front cover), such as a glass, plastic, or other substantially transparent material, component, or assembly, attached to a housing 104. The cover 102 may be positioned over a display 103. The cover 102 may be formed from glass (e.g., a chemically strengthened glass), sapphire, ceramic, glass-ceramic, plastic, or another suitable material.

The display 103 may be at least partially positioned within the interior volume of the housing 104. The display 103 may be coupled to the cover 102, such as via an adhesive or other coupling scheme. The display 103 may include a liquid-crystal display (LCD), light-emitting diode, organic light-emitting diode (OLED) display, an active layer organic light emitting diode (AMOLED) display, organic electroluminescent (EL) display, electrophoretic ink display, or the like. The display 103 may be configured to display graphical outputs, such as graphical user interfaces, that the user may view and interact with. The device 100 may also include an ambient light sensor that can determine properties of the ambient light conditions surrounding the device 100. The device 100 may use information from the ambient light sensor to change, modify, adjust, or otherwise control the display 103 (e.g., by changing a hue, brightness, saturation, or other optical aspect of the display based on information from the ambient light sensor).

The display 103 may include or be associated with one or more touch- and/or force-sensing systems. In some cases, components of the touch- and/or force-sensing systems are integrated with the display stack. For example, electrode layers of a touch- and/or force-sensor may be provided in a stack that includes display components (and is optionally attached to or at least viewable through the cover 102).

The touch- and/or force-sensing systems may use any suitable type of sensing technology, including capacitive sensors, resistive sensors, surface acoustic wave sensors, piezoelectric sensors, strain gauges, or the like. The outer or exterior surface of the cover 102 may define an input surface (e.g., a touch- and/or force-sensitive input surface) of the device. While both touch- and force-sensing systems may be included, in some cases the device 100 includes a touch-sensing system and does not include a force-sensing system.

The device 100 may also include a front-facing camera 106. The front-facing camera 106 may be positioned below or otherwise covered and/or protected by the cover 102. The front-facing camera 106 may have any suitable operational parameters. For example, the front-facing camera 106 may include a 7.2 megapixel sensor (with 1 micron pixel size), and a fixed-focus lens with an aperture number of f/2.2. Other types of cameras may also be used for the front-facing camera 106.

The device 100 may also include a button 108 with which a user may interact to control aspects of the device 100. In some cases, the button 108 is configured to not move (or to be substantially non-movable) relative to the device 100. In such cases, the button 108 may be touch- and/or force-sensitive so as to detect user inputs applied to the button 108. The button 108 may be associated with a haptic actuator (e.g., the haptic actuator 214, FIG. 2) that is configured to produce a haptic output in response to detecting an input at the button 108. The haptic output, which may be a vibration, pulse, shake, electrostatic stimulus, or other type of tactile output, may indicate to a user that an input has been detected.

The button 108 may also include a fingerprint sensor (or include components of a fingerprint sensor). The fingerprint sensor may be configured to capture an image or other representative data of a finger that is in contact with the button 108. The device may verify that a user is an authorized user by comparing a captured image (or other representative data) of a finger that is in contact with the button 108 with stored images (or other representative data) of authorized users.

The device 100 may also include other buttons (e.g., buttons 116, 120), switches (e.g., switch 118), and/or other physical input systems. Such input systems may be used to control power states (e.g., the button 120), change speaker volume (e.g., buttons 116), switch between "ring" and "silent" modes, and the like (e.g., the switch 118).

The device 100 may also include a speaker outlet 110 to provide audio output to a user, such as to a user's ear during voice calls. The device 100 may also include a charging port 112 (e.g., for receiving a power cable for providing power to the device 100 and charging the battery of the device 100).

The device 100 may also include loudspeaker openings 114. The loudspeaker openings 114 may allow sound output from an internal speaker system (e.g., the speaker system 216, FIG. 2) to exit the housing 104. The device 100 may also include one or more microphones. In some cases, a microphone within the housing 104 may be acoustically coupled to the surrounding environment through a loudspeaker opening 114.

The housing 104 may be a multi-piece housing. For example, the housing 104 may be formed from multiple housing members 124, 126, 128, and 130, which are structurally coupled together via one or more joint structures 122 (e.g., 122-1-122-4). Together, the housing members 124, 126, 128, and 130 and the joint structures 122 may define a band-like structure that defines four sidewalls (and thus four exterior side surfaces) of the device 100. Thus, both the housing members and the joint structures define portions of the exterior side surfaces of the device 100.

The housing members 124, 126, 128, and 130 may be formed of a conductive material (e.g., a metal such as aluminum, stainless steel, or the like), and the joint structures 122 may be formed of one or more polymer materials (e.g., glass-reinforced polymer). The joint structures 122 may include two or more molded elements, which may be formed of different materials. For example, an inner molded element may be formed of a first material (e.g., a polymer material), and an outer molded element may be formed of a second material that is different from the first (e.g., a different polymer material). The materials may have different properties, which may be selected based on the different functions of the inner and outer molded elements. For example, the inner molded element may be configured to make the main structural connection between housing members, and may have a higher mechanical strength and/or toughness than the outer molded element. On the other hand, the outer molded element may be configured to have a particular appearance, surface finish, chemical resistance, water-sealing function, or the like, and its composition may be selected to prioritize those functions over mechanical strength).

In some cases, one or more of the housing members 124, 126, 128, and 130 (or portions thereof) are configured to operate as antennas (e.g., members that are configured to transmit and/or receive electromagnetic waves to facilitate wireless communications with other computers and/or devices). To facilitate the use of the housing members as antennas, feed and ground lines may be conductively coupled to the housing members to couple the housing members to other antenna and/or communication circuitry. Further, the joint structures 122 may be substantially non-conductive to provide suitable separation and/or electrical isolation between the housing members (which may be used to tune the radiating portions, reduce capacitive coupling between radiating portions and other structures, and the like).

The joint structures 122 may be mechanically interlocked with the housing members to structurally couple the housing members and form a structural housing assembly. Further details about the joint structures 122 and their mechanical integration with the housing members are provided herein, such as with respect to FIGS. 4A-4B.

The exterior surfaces of the housing members 124, 126, 128, and 130 may have substantially a same color, surface texture, and overall appearance as the exterior surfaces of the joint structures 122. In some cases, the exterior surfaces of the housing members 124, 126, 128, and 130 and the exterior surfaces of the joint structures 122 are subjected to at least one common finishing procedure, such as abrasive-blasting, machining, polishing, grinding, or the like. Accordingly, the exterior surfaces of the housing members and the joint structures may have a same or similar surface finish (e.g., surface texture, roughness, pattern, etc.). In some cases, the exterior surfaces of the housing members and the joint structures may be subjected to a two-stage blasting process to produce the target surface finish.

Figure 1B:
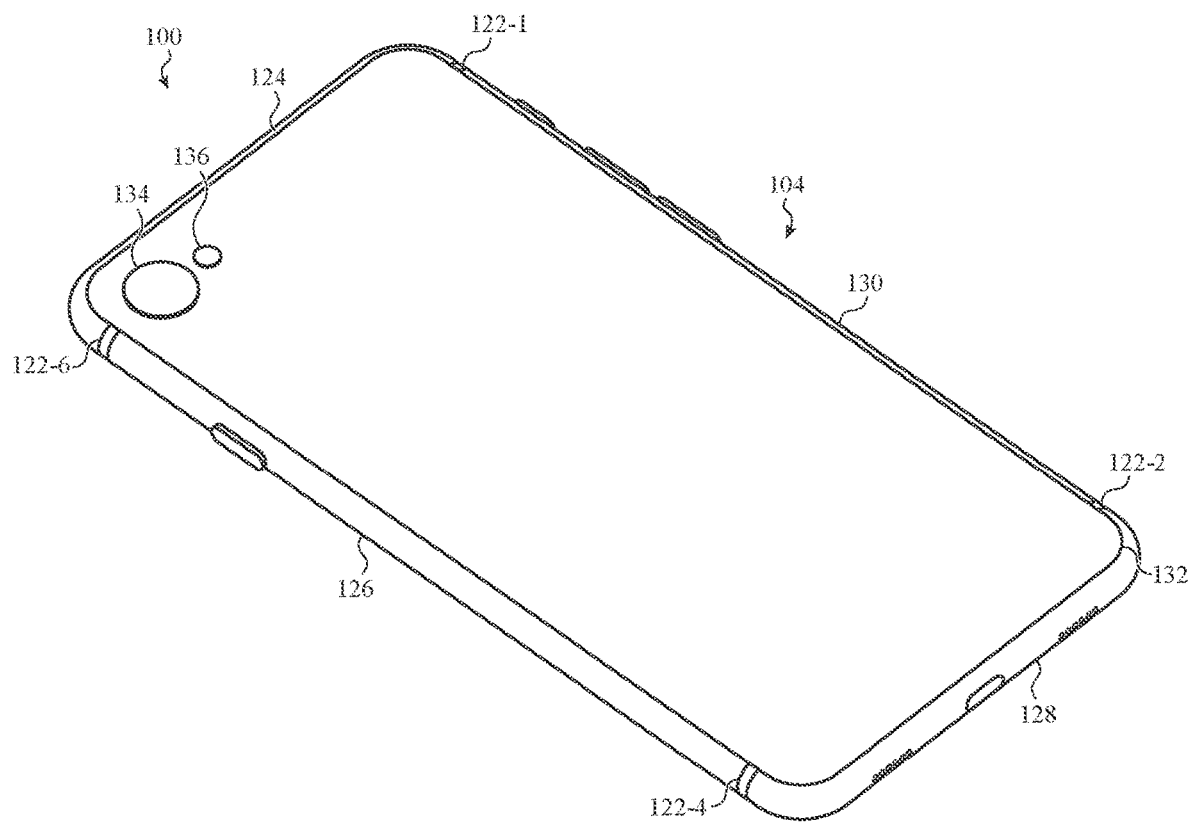

FIG. 1B illustrates a back side of the device 100. The device 100 may include a back cover 132 coupled to the housing 104. The back cover 132 may include a substrate formed of glass, though other suitable materials may alternatively be used (e.g., plastic, sapphire, ceramic, ceramic glass, etc.). The back cover 132 may define a back exterior surface of the device 100. The back cover 132 may include one or more decorative layers on the exterior or interior surface of the substrate. For example, one or more opaque layers may be applied to the interior surface of the substrate (or otherwise positioned along the interior surface of the substrate) to provide a particular appearance to the back side of the device 100. The opaque layer(s) may include a sheet, ink, dye, or combinations of these (or other) layers, materials, or the like. In some cases the opaque layer(s) have a color that substantially matches a color of the housing 104 (e.g., the exterior surfaces of the housing members and the joint structures). The device 100 may include a wireless charging system, whereby the device 100 can be powered and/or its battery recharged by an inductive (or other electromagnetic) coupling between a charger and a wireless charging system within the device 100. In such cases, the back cover 132 may be formed of a material that allows and/or facilitates the wireless coupling between the charger and the wireless charging system (e.g., glass).

The device 100 may also include a rear-racing camera 134 and a flash 136 that is configured to illuminate a scene to facilitate capturing images with the camera 134. The camera 134 may include a 12 megapixel sensor (with 1.4 micron pixel size), and a variable-focus lens with an aperture number of f/1.8. The camera 134 may also include optical image stabilization, whereby the lens is dynamically moved relative to a fixed structure within the device 100 to reduce the effects of "camera shake" on images captured by the camera 134.

The camera 134, along with associates processors and software, may provide several image-capture features. For example, the camera 134 may be configured to capture full-resolution video clips of a certain duration each time a user captures a still image. As used herein, capturing full-resolution images (e.g., video images or still images) may refer to capturing images using all or substantially all of the pixels of an image sensor, or otherwise capturing images using the maximum resolution of the camera (regardless of whether the maximum resolution is limited by the hardware or software).

The captured video clips may be associated with the still image. In some cases, users may be able to select individual frames from the video clip as the representative still image associated with the video clip. In this way, when the user takes a snapshot of a scene, the camera will actually record a short video clip (e.g., 1 second, 2 seconds, or the like), and the user can select the exact frame from the video to use as the captured still image (in addition to simply viewing the video clip as a video).

The camera 134 may also include a high-dynamic-range (HDR) mode, in which the camera 134 captures images having a dynamic range of luminosity that is greater than what is captured when the camera 134 is not in the HDR mode. In some cases, the camera 134 automatically determines whether to capture images in an HDR or non-HDR mode. Such determination may be based on various factors, such as the ambient light of the scene, detected ranges of luminosity, tone, or other optical parameters in the scene, or the like. HDR images may be produced by capturing multiple images, each using different exposure or other image-capture parameters, and producing a composite image from the multiple captured images.

The camera 134 may also include an object detection mode, in which a user can select (and/or the device 100 can automatically identify) objects within a scene to facilitate those objects being processed, displayed, or captured differently than other parts of the scene. For example, a user may select (or the device 100 may automatically identify) a person's face in a scene, and the device 100 may focus on the person's face while selectively blurring the portions of the scene other than the user's face. Further details of the object detection mode are provided herein with reference to FIGS. 5A-5B. Notably, features such as the HDR mode and the object detection mode may be provided with a single camera (e.g., a single lens and sensor)

The flash 136 is configured to illuminate a scene to facilitate capturing images with the camera 134. The flash 136 may include one or more light sources, such as one or more light emitting diodes (e.g., 1, 2, 3, 4, or more LEDs). The flash 136, in conjunction with the camera 134 or other systems of the device 100, may adjust the color temperature of the light emitted by the light sources in order to match or otherwise adapt to a color temperature within a scene being. The device 100 may also be configured to operate the flash 136 and the shutter of the camera 134 to avoid consequences of flash "flicker." For example, the device 100 may avoid capturing exposures during moments where the flash 136 is at a period of no or low illumination (e.g., which may be caused by discontinuous or pulsed operation of the LEDs).

Figure 2:
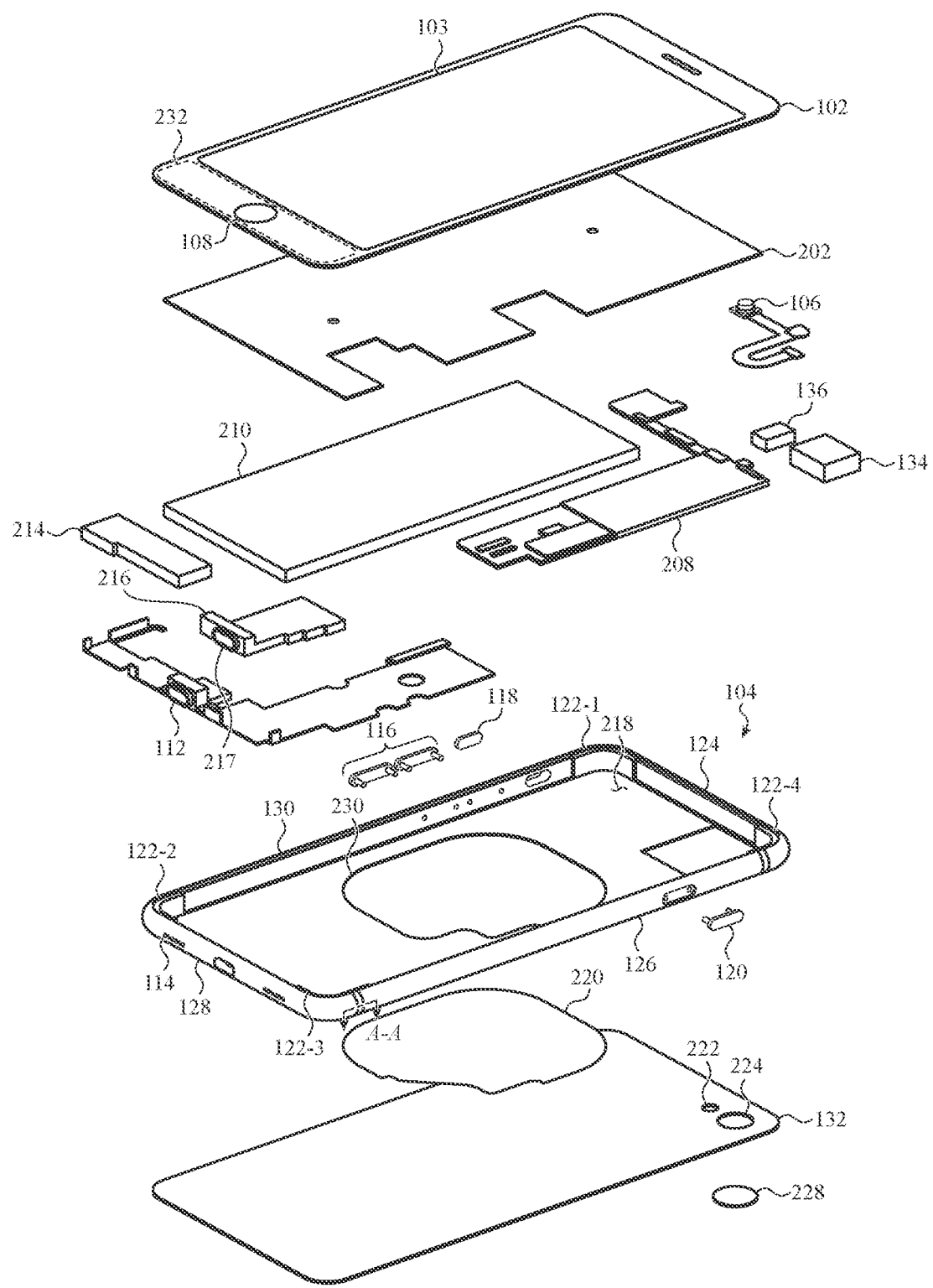
FIG. 2 depicts an exploded view of the device of FIGS. 1A-1B.

FIG. 2 is an exploded view of the device 100, showing various components of the device 100 and example arrangements and configurations of the components. As described above, the device 100 includes a cover 102, which may be formed of glass, and which may have a display 103 attached thereto. As shown in FIG. 2, the display 103 is attached to an internal surface of the cover 102. The display 103 may include touch- and/or force-sensing systems (and/or components of the touch- and/or force-sensing systems), as described herein. A circuit element 232 may also be attached to the cover 102, and may include conductive traces to carry electrical signals to and from electrical components of the button 108. Additional details of the circuit element 232 (as well as other embodiments of the circuit element) are provided herein with respect to FIGS. 3A-3F.

The device 100 may also include a chassis 202 below the cover 102 and the display 103. The chassis 202 may be formed of metal (or another suitable material), and may act as a structural support for components within the device 100. In some cases, the chassis 202 provides shielding between device components, such as between the display stack (including display components and touch sensor components) and other components like the haptic actuator 214, speaker system 216, and the like.

FIG. 2 also illustrates the front-facing camera 106 and the rear-facing camera 134 (which may each include a lens, sensor, optional image stabilizing system, and the like), as well as the flash 136. These components may be aligned with transparent portions of the front and/or back covers (or openings through the covers) to facilitate imaging operations through the covers. For example, the rear-facing camera 134 may be aligned with an opening 224 in the back cover 132. A lens cover 228 (e.g., formed of a transparent material such as glass, sapphire, plastic, etc.) may overlie the lens of the camera 134 and cover the opening 224. The lens cover 228 may extend beyond the exterior surface of the back cover 132, and may define a recess along the interior side of the back cover 132, such that the lens of the camera 134 can extend into the recess. In this way, the device 100 may accommodate a larger lens than would be possible if the recess were not provided.

The device 100 also includes a battery 210. The battery 210 may provide electrical power to the device 100 and its various systems and components. The battery 210 may be recharged via the charging port 112 (e.g., from a power cable plugged into the charging port 112), and/or via a wireless charging system 220. The battery 210 may be coupled to the charging port 112 and/or the wireless charging system 220 via battery control circuitry that controls the power provided to the battery and the power provided by the battery to the device 100. The battery 210 may be a lithium ion battery, or any other suitable type of rechargeable battery.

The charging system 220 may include a coil that inductively couples to an output or transmitting coil of a wireless charger. The coil may provide current to the device 100 to charge the battery 210 and/or power the device.

The device 100 may also include a speaker system 216. The speaker system 216 may be positioned in the device 100 so that an outlet port 217 is aligned with or otherwise proximate a loudspeaker opening 114. Accordingly, sound that is output by the speaker system 216 exits the housing 104 via the loudspeaker opening 114. The speaker system 216 may include a speaker positioned in a housing that defines a speaker volume (e.g., an empty space in front of or behind a speaker diaphragm). The speaker volume may be used to tune the audio output from the speaker and optionally mitigate destructive interference of the sound produced by the speaker.

The device 100 may also include a haptic actuator 214. The haptic actuator may include a movable mass and an actuation system that is configured to move the mass to produce a haptic output. The actuation system may include one or more coils and one or more magnets (e.g., permanent and/or electromagnets) that interact to produce motion. The magnets may be or may include recycled magnetic material.

When the coil(s) are energized, the coil(s) may cause the mass to move, which results in a force being imparted on the device 100. The motion of the mass may be configured to cause a vibration, pulse, tap, or other tactile output detectable via an exterior surface of the device 100. The haptic actuator 214 may be configured to move the mass linearly, though other movements (e.g., rotational) are also contemplated. Other types of haptic actuators may be used instead of or in addition to the haptic actuator 214.

The device 100 also includes a logic board 208. The logic board 208 may include a substrate, and processors, memory, and other circuit elements coupled to the substrate. The logic board 208 may also include wireless communications circuitry, which may be coupled to and/or otherwise use the housing members 124, 126, 128, 130 (or portions thereof) as radiating structures to provide wireless communications. The logic board 208 may also include components such as accelerometers, gyroscopes, near-field-communications circuitry and/or antennas, compasses, and the like.

The housing 104 may also include a frame 218, which may be attached to the housing 104. The frame 218 may be formed of metal, and may act as a structural mounting point for components of the device 100. The frame 218 may define an opening 230 that corresponds to the wireless charging system 220, such that the frame 218 does not shield the wireless charging system 220 or otherwise negatively affect the inductive coupling between the coil of the charging system 220 and an external wireless charger.

As described above, the housing 104 may include housing members 124, 126, 128, and 130 structurally joined together via joint structures 122. FIG. 2 illustrates how the joint structures 122 may extend over inner surfaces of the housing members. More particularly, a portion of the joint structures 122 may contact, cover, encapsulate, and/or engage with retention features of the housing members that extend from the inner surfaces of the housing members.

Figure 3A:
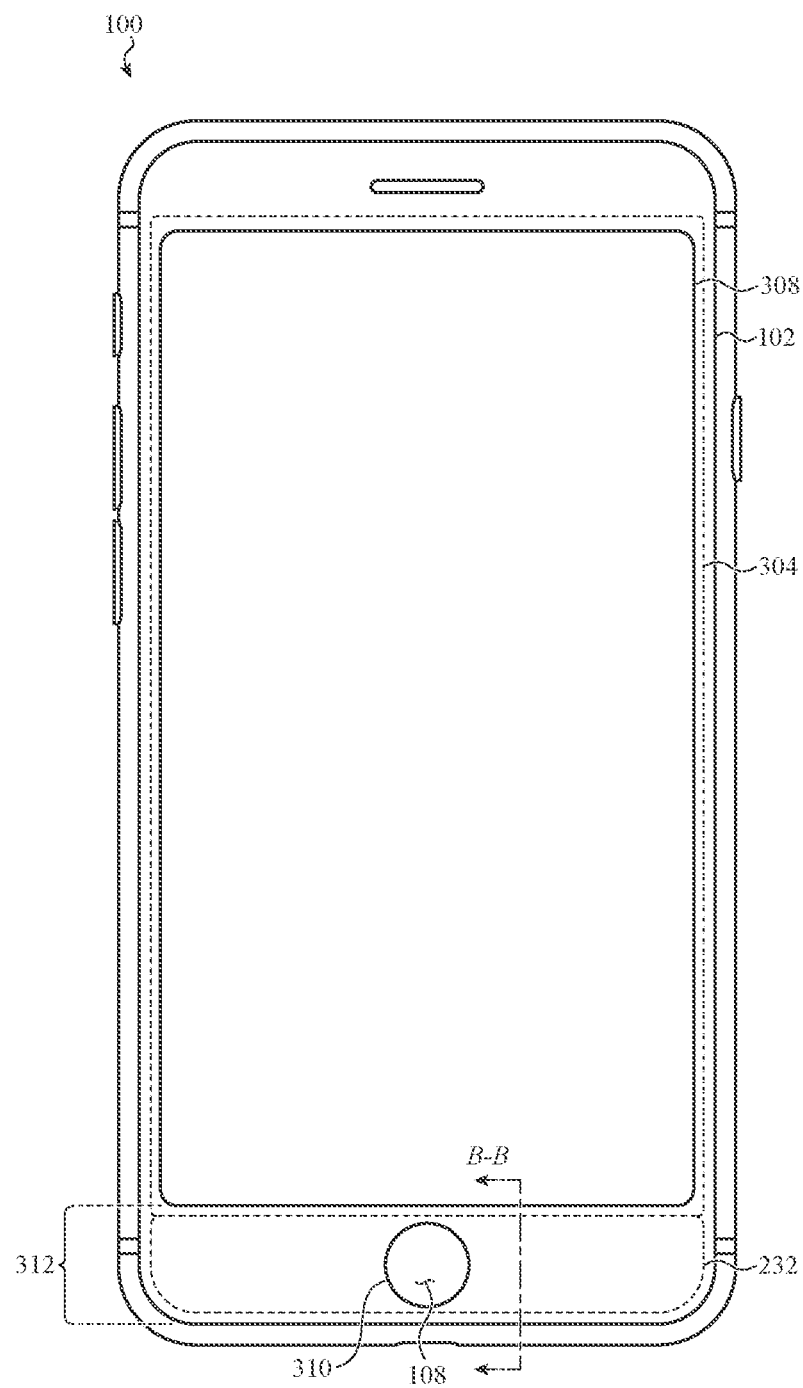
FIG. 3A depicts a front view of the device of FIGS. 1A-1B.

FIG. 3A is a front view of the device 100. FIG. 3A illustrates how a circuit element (e.g. a circuit board) 232 may be positioned in the device 100 to carry electrical signals from the button 108 to and/or from other electrical components of the device 100, as well as how a shim 304 may be positioned in the device to provide structural support to the stack of components below the cover 102. As shown in FIG. 3A, the device 100 may include a cover 102 that is positioned over a display (e.g., the display 103, FIGS. 1A, 2). The display 103 may include a display stack 302 (FIG. 3B), and may define an active region that is configured to produce a graphical output. The active region may generally correspond to the boundary 308 shown in FIG. 3A. In some cases, the boundary 308 in FIG. 3A is a boundary between a transparent portion of the cover 102 and a masked portion of the cover 102 (e.g., an opaque portion that is configured to mask or block the appearance of internal components of the device 100). The boundary 308 may therefore correspond to the active region of the display 103.

The cover 102 defines a first portion that covers the active region of the display (as indicated by the boundary 308), as well as a second portion corresponding to an area 312 adjacent the active region of the display 103. The cover 102 may define a hole 310 in the area 312 that extends through the cover 102 and in which an element of the button 108 (e.g., a component that the user presses or touches to provide an input to the button 108) may be positioned. The button 108 may include or be associated with a force-sensing system that is configured to detect an input applied to the button element. As shown in FIG. 3A, the circuit element 232 may be conductively coupled to the force-sensing system to carry electrical signals to and from the button 108 (and associated force-sensing system).

Figure 3B:
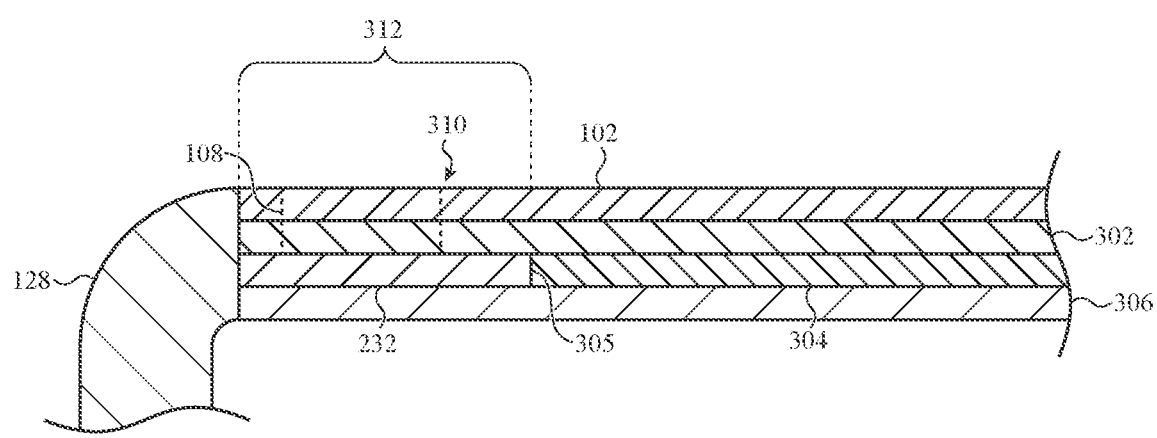
FIG. 3B depicts a partial cross-sectional view of a portion of the device of FIGS. 1A-1B.

FIG. 3B is a partial cross-sectional view of a portion of the device 100, viewed along line B-B in FIG. 3A, and illustrates an example configuration for conductively coupling the button 108 (and its fingerprint, touch- and/or force-sensing components) to other components in the device 100 (e.g., processors and/or other sensing circuitry that facilitate force, touch, and/or fingerprint sensing functions). The cross-sectional view in FIG. 3B shows the cover 102, a display 302, the circuit element 232, a shim 304, and a frame member 306. The button 108, which may be positioned in the hole 310 in the cover 102 (and optionally in an opening in the display stack) is shown in phantom lines. In some cases, the display stack 302 may not extend under the button 108. The cover 102 may be formed of glass, as described above, or another transparent material such as plastic, sapphire, a glass-ceramic, or the like.

The display stack 302 may include components of a display, including, for example, back reflector layer(s), LEDs or other light sources, light guide layer(s), light redirection layer(s), polarizer(s), diffuser(s), liquid crystal layer(s), electrode layer(s), and the like. In some cases, the display stack includes a light diffusing layer and a light redirection layer. The thicknesses of the light redirection layer and the light diffusing layer may be selected to provide an even, homogenous illumination of the display. In some cases, the light diffusing layer may have a thickness of about 50 microns, and the light redirection layer has a thickness of about 110 microns (though other thicknesses for these components are also contemplated).

In cases where the display stack 302 includes components for touch- and/or force-sensing systems, the display stack 302 may also include electrode layer(s), compliant layer(s) (e.g., between two electrode layers), and/or other suitable components of the touch- and or force-sensing systems. The frame member 306 may be the chassis 202, or it may be another sheet, substrate, or component that is between the display stack 302 and the chassis 202. The frame member 306 may be formed of metal.

The button 108, as described above, may include components of touch- and/or force-sensing systems, as well as components of a fingerprint sensor. Such components may include, for example, electrode layers that facilitate sensing of a user's finger (for touch-sensing functions), sensing a force applied to the button (for force-sensing functions), and/or for capturing data representative of a user's finger (for a fingerprint sensor). These layers alone may not constitute the entire sensing systems, however, and they may need to be coupled to processing systems or other circuitry that is elsewhere in the device, such as on the logic board 208. Accordingly, the circuit element 232 may be provided in the stack-up shown in FIG. 3A. For example, the circuit element 232 may be positioned below the area 312 of the cover 102.

The circuit element 232 may include a substrate (e.g., a flexible circuit substrate) with conductive traces thereon. The conductive traces may be conductively coupled to components of the button 108, such as electrode layers. The conductive traces may also be conductively coupled to other components within the device, such as processors, sensor circuitry, or the like, to facilitate the sensing functions provided via the button 108. In some cases, the button 108 is mechanically retained to the circuit element 232, such that the circuit element 232 and the button 108 may be installed in the device 100 as a single component. In other cases, the button 108 is conductively coupled to the circuit element 232 via connectors, solder joints, conductive adhesives, or the like.

The circuit element 232 may define a top surface and a bottom surface opposite the top surface. The top surface of the circuit element 232 may be in contact with (and optionally secured to) a bottom surface of the display stack, and the bottom surface of the circuit element 232 may be in contact with (and optionally secured to) a top surface of the frame member. The circuit element 232 may also define a side surface extending form the top surface to the bottom surface, and which may be in contact with (and optionally secured to) a corresponding side surface of the shim 304 (e.g., along interface 305).

Because at least part of the circuit element 232 is positioned below the display stack 302 and above the frame member 306 (and in a region below a frame or border region that is outside the active region of the display 103, such as the area 312), a shim 304 may be positioned below the display stack 302 and above the frame member 306 and (and adjacent the active region of the display) to take up space between the display stack 302 and the frame member 306.

The shim 304 may have substantially the same thickness as the circuit element 232, such that an empty space is not left between the display stack 302 and the frame member 306 below the active region of the display. In this way, the cover 102 and the display stack 302 may be stiffer and less likely to deflect or deform when a user touches, presses on, or otherwise interacts with the cover 102. This added stiffness and support of the display stack 302 and cover 102 helps reduce display degradation due to bending and/or deformation of the display stack 302 during use (or impact events). It may also help prevent or limit localized deformations of the cover 102, thereby reducing the risk of the cover 102 breaking or cracking from use or impacts.

The shim 304 may define a top surface and a bottom surface opposite the top surface. Similar to the configuration of the circuit element 232, the top surface of the shim 304 may be in contact with (and optionally secured to) a bottom surface of the display stack, and the bottom surface of the shim 304 may be in contact with (and optionally secured to) a top surface of the frame member. Thus, at least portions of the top surfaces of the shim 304 and the circuit element 232 are in contact with the same surface of the component(s) positioned above the shim 304 and the circuit element 232. Similarly, at least portions of the bottom surfaces of the shim 304 and the circuit element 232 are in contact with the same surface of the component(s) positioned below the shim 304 and the circuit element 232.

The shim 304 may also define a side surface extending form the top surface to the bottom surface, and which may be in contact with (and optionally secured to) a corresponding side surface of the circuit element 232. Further, the top surfaces of the shim 304 and the circuit element 232 may be substantially coplanar, and the bottom surfaces of the shim 304 and the circuit element 232 may also be substantially coplanar.

The shim 304 may include one or more polymer sheets, and may lack conductive traces, electrodes, or other circuit elements. The shim 304 may be formed from a substantially non-conductive material (e.g., polyethylene terephthalate), and may be electrically isolated from electrical components of the device. Further, the shim 304 may not be part of the display stack, and may not perform any optical functions. In some cases, the shim 304 may be made of the same material as the substrate of the circuit element 232 (e.g., polyethylene terephthalate, polyimide, or another suitable material).

Figure 3C:
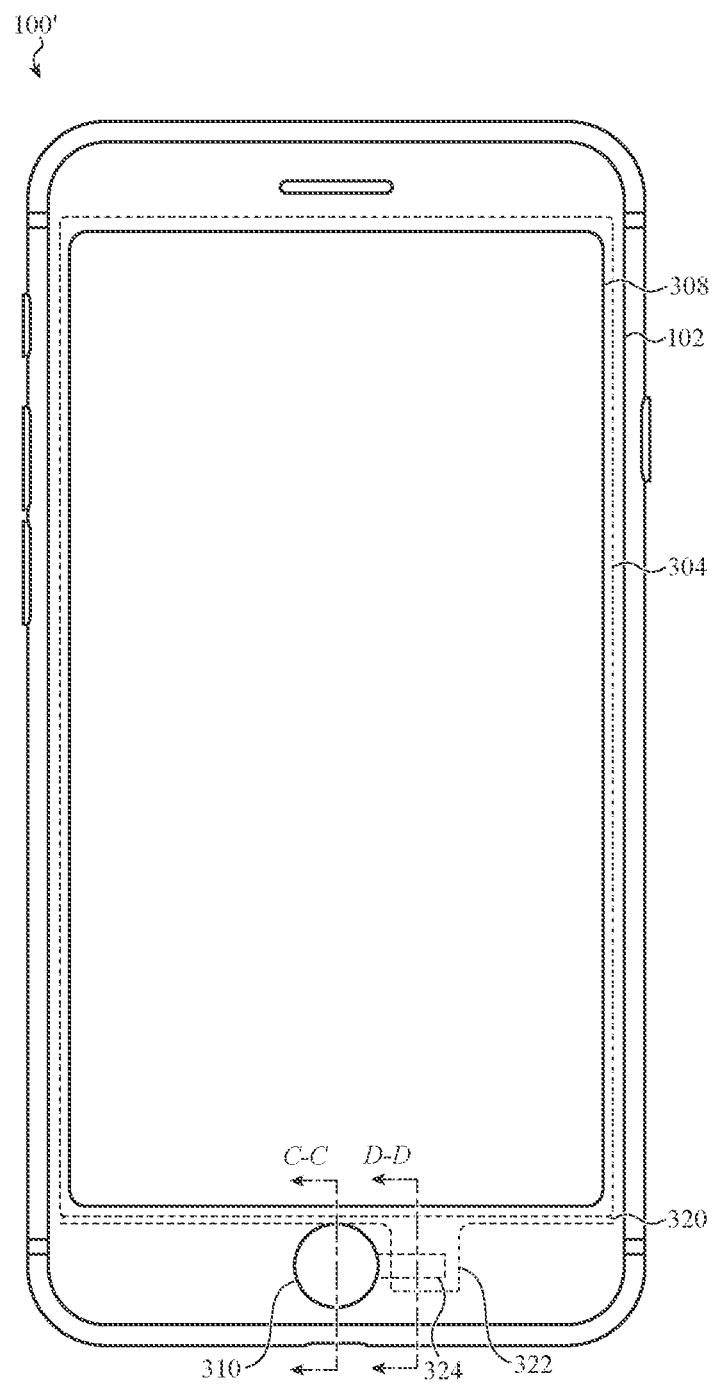
FIG. 3C depicts a front view of another example electronic device.

FIG. 3C is a front view of another embodiment of the device 100, labeled as 100' (components of the device 100' that are the same as or essentially the same as those of the device 100 are given the same reference numbers used for the device 100). In particular, FIG. 3C illustrates another example of how a circuit element 320 (e.g. a circuit board) may be positioned in the device 100 to carry electrical signals from the button 108 to and/or from other electrical components of the device 100. For example, the circuit element 320 may occupy less of the space below the area 312 that is adjacent the active region of the display 103 than the circuit element 232. The circuit element 320 may define a tongue portion 322 that extends further into the area 312 and is conductively coupled to the button 108 via a connector 324. Notably, a portion of the circuit element 232 is positioned between the frame member 306 and the display stack 302, and as such the shim 304 is still positioned between the frame member 306 and the display stack 302 in the area below the active region of the display.

Figure 3D:
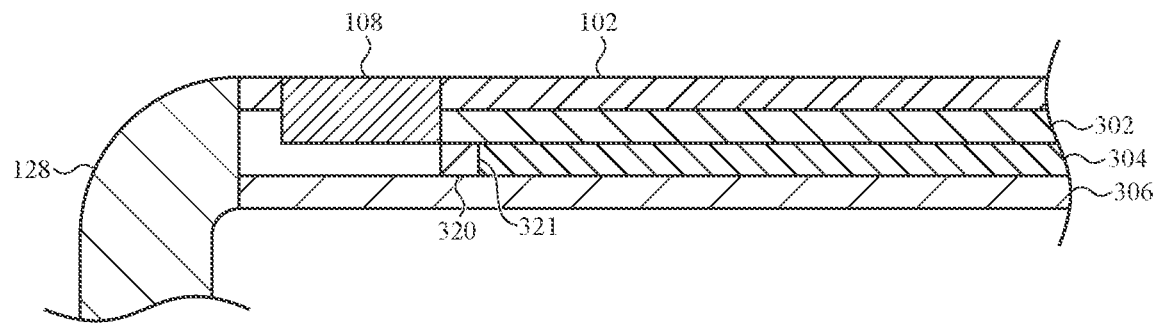
FIGS. 3D-3E depict partial cross-sectional views of the device of FIG. 3C.
Figure 3E:
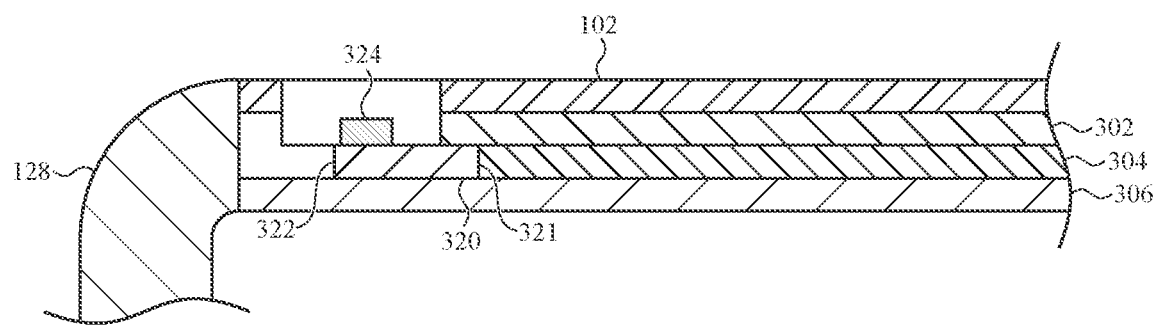

FIG. 3D is a partial cross-sectional view of the device 100', viewed along line C-C in FIG. 3C, and FIG. 3E is a partial cross-sectional view of the device 100', viewed along line D-D in FIG. 3C. FIG. 3C illustrates how a portion of the circuit element 320 is between the display stack 302 and the frame member 306, and how the shim 304 is positioned in a remaining portion of the space between the display stack 302 and the frame member 306. FIG. 3D illustrates how the tongue portion 322 of the circuit element 320 may extend further into the space below the area 312 and be conductively coupled to a connector 324 that is associated with the button 108 (and any associated force-, touch-, and/or fingerprint sensors). In some cases, the circuit element 320 may also define a side surface extending form the top surface to the bottom surface, and which may be in contact with (and optionally secured to) a corresponding side surface of the shim 304 (e.g., along interface 321)

While the examples illustrated in FIGS. 3A-3E show circuit elements and shims positioned between a frame member and a display stack, other configurations are also contemplated. For example, FIG. 3F illustrates a partial cross-sectional view of another embodiment of the device 100, labeled as 100'' (components of the device 100'' that are the same as or essentially the same as those of the device 100 are given the same reference numbers used for the device 100).

Figure 3F:
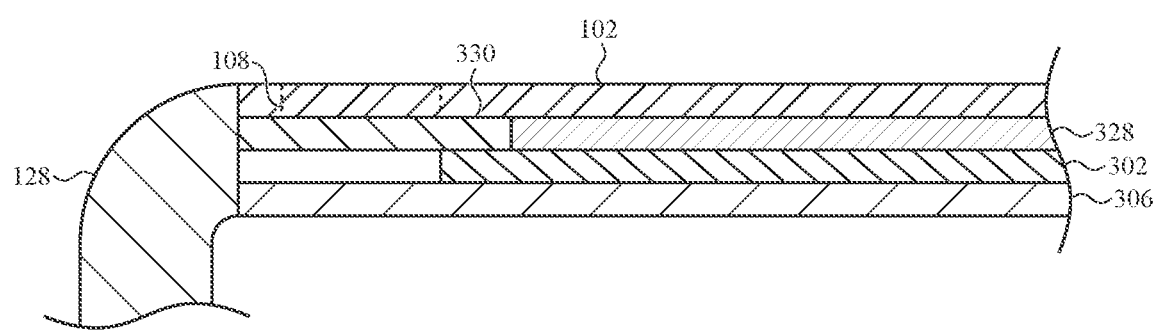
FIG. 3F depicts a partial cross-sectional view of another example electronic device.

As shown in FIG. 3F, a portion of a circuit element 330 (which may be an embodiment of the circuit elements 232, 320) may be positioned between the cover 102 and the display stack 302, and a shim 328 (which may be an embodiment of the shim 304) may also be positioned between the cover 102 and the display stack 302.

In some cases, a portion of the circuit element 330 and the shim 328 are positioned between layers of the display stack 302, or between other components of a device. For example, the shim 328 may be positioned between (and optionally in contact with or attached to) any two components that the circuit element 330 is also between (and optionally in contact with or attached to). In this way, the shim can be used to prevent bending or flexing of components in a stackup, increase stiffness of the stackup and/or the device as a whole, prevent or reduce visible distortions due to deformations in a display stack, as well as to perform other possible functions.

Figure 4A:
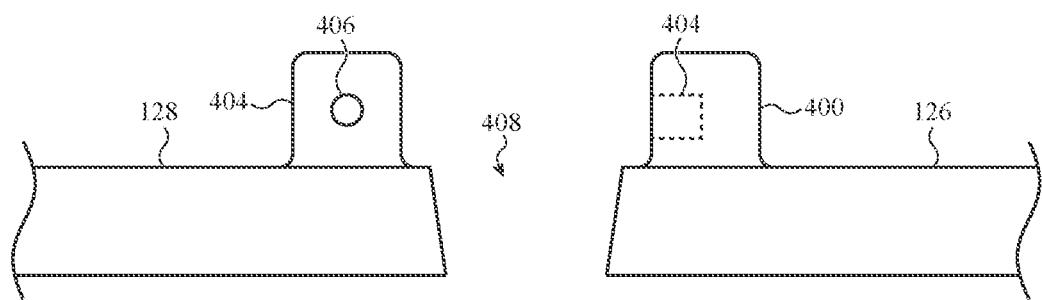
FIG. 4A depicts a portion of a housing of the device of FIGS. 1A-1B.
Figure 4B:
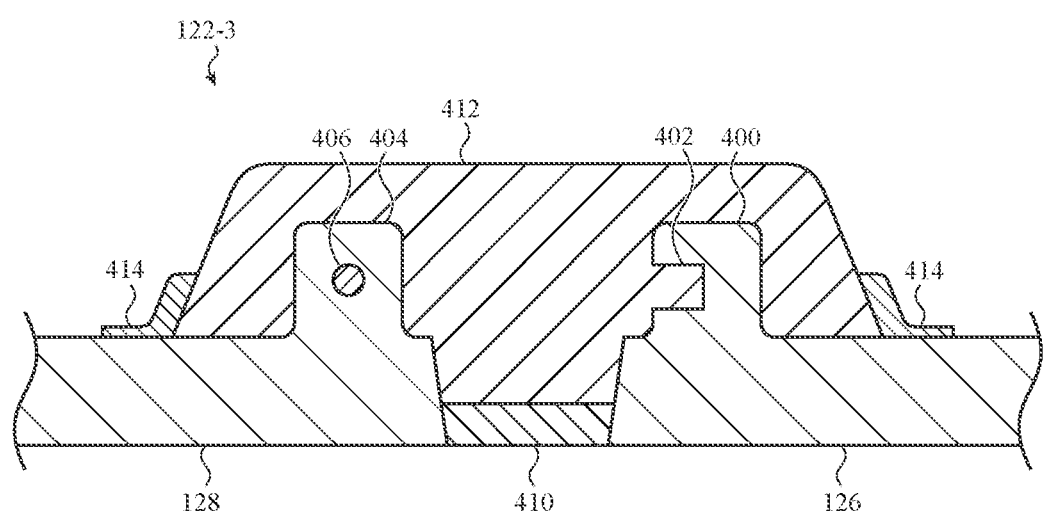
FIG. 4B depicts a partial cross-sectional view of a portion of the device of FIGS. 1A-1B.

As noted above, the housing 104 may include housing members 124, 126, 128, 130 joined together with joint structures 122. FIGS. 4A-4B illustrate example configurations of the housing members and the joint structures 122. While one of the joint structures of the device 100 is illustrated in FIGS. 4A-4B, the other joint structures (as well as the associated housing members) may have the same or similar configurations.

FIG. 4A shows the housing members 126, 128 without a joint structure (e.g., prior to a joint structure 122-3 being molded into engagement with the housing members). The housing members 126, 128 may be separated by a gap 408. The gap 408, which is subsequently filled with the joint structure 122-3, may have a particular separation distance between the housing members 126, 128. The separation distance may be selected so as to reduce capacitive coupling between the two housing members 126, 128, which may be operating as radiating antenna structures.

The housing members 126, 128 may define engagement structures 400, 404 (respectively), which may protrude from an interior surface of the housing members 126, 128. The joint structure may engage the engagement structures 400, 404 to structurally retain the housing members 126, 128 and define a rigid housing structure for the device 100. The joint structure 122-3 may engage the engagement structures 400, 404 in various ways to form a strong and rigid mechanical engagement. For example, the engagement structures 400, 404 (or other portions of the housing members 126, 128)

may define geometric features with which the joint structure 122-3 interlocks. For example, the engagement structure 400 may define a blind hole 402, and the engagement structure 404 may define a through hole 406. The joint structure 122-3 may be formed by injecting a flowable material into the gap 408 and at least partially around or against the engagement structures 400, 404 (and at least partially into the holes 402, 406). In some cases, the material of the joint structure 122-3 completely or partially encapsulates the engagement structures 400, 404 (as shown in FIG. 4B). The injected joint structure material may then harden (e.g., by cooling or curing), thereby forming secure mechanical interlocks between the joint structure 122-3 and the engagement structure 400, 404.

While FIGS. 4A-4B illustrate two example engagement structures with example geometric features, other configurations of the engagement structures are also contemplated. For example, additional or different types of features may be included in or otherwise defined by the engagement structures and/or housing members 126, 128, including threaded holes, undercuts, posts, threaded posts, dovetail recesses, channels, or the like.

FIG. 4B is a partial cross-sectional view of the device 100, viewed along line A-A in FIG. 2, showing the joint structure 122-3 engaged with the engagement structures 400, 404. As shown, the joint structure 122-3 includes a first or inner molded element 412, and a second or outer molded element 410. The inner molded element 412 may structurally interlock with the engagement structures 400, 404, as described above. The inner molded element 412 may be formed of a first material, such as a fiber-reinforced polymer material (or any other suitable material). In some cases the inner molded element 412 does not include reinforcing fibers.

The outer molded element 410 may define a portion of an exterior surface of the housing 104. For example, as shown in FIG. 4B, the outer molded element 410 and the portions of the housing members 126, 128 that are adjacent the outer molded element 410 may define a substantially continuous segment of the exterior surface of the housing 104. The outer molded element 410 may be formed of a second material that is different from the first material. For example, the outer molded element 410 may be formed from a fiber-reinforced polymer material that uses a different matrix material and/or a different type of reinforcing fiber (and/or a different fill ratio of reinforcement fibers to matrix material).

The outer molded element 410 may be configured to have a color that substantially matches the color of the housing members 126, 128 (and optionally all of the housing members of the housing 104). Accordingly, the outer molded element 410 may include dyes, inks, or other coloring agents to match the color of the housing. The housing members may be formed of anodized aluminum, which may be produced in multiple different colors (e.g., with dyes). Different dyes or other coloring agents may therefore be used to match the color of the outer molded element 410 to the color of the particular anodized aluminum selected for a given housing.

The outer molded element 410 may securely attach to the inner molded element 412 and/or the housing members 126, 128 via adhesive bonds and/or mechanical engagements or interlocks. For example, the inner molded element 412 and/or the housing members 126, 128 may define engagement structures (e.g., posts, holes, undercuts, channels, etc.) with which the outer molded element 410 engage to form a secure mechanical engagement between the outer molded element 410 and the other components of the housing.

The inner molded element 412 may be formed by positioning the housing members 126, 128 in a mold (and securing them such that the gap 408 is fixed at a target size), and injecting the material of the inner molded element 412 into the gap 408 and around or otherwise into engagement with the engagement structures 400, 404 (e.g., into the holes 402, 406). The inner molded element 412 may not completely fill the gap 408, thus leaving a space in the gap or the outer molded element 410. The outer molded element 410 may then be formed by injecting the material of the outer molded element 410 into the gap 408 and against a surface of the inner molded element 412, such that the material of the outer molded element 410 occupies the remaining space in the gap 408 and defines an exterior surface of the housing.

After forming the inner and outer molded elements, the housing members 126, 128 and the outer molded element 410 may be subjected to further finishing operations. For example, at least the exterior surfaces of the housing members 126, 128 and the outer molded element 410 may be subjected to a series of blasting operations, such as a two-stage blasting process. The first stage of the process may include directing a stream of first abrasive particles onto the exterior surfaces of the housing, while the second stage may include directing a stream of second abrasive particles onto the exterior surfaces of the housing. The first and second particles may have different properties, such as different sizes, different materials, different roughnesses, different shapes, or the like. In some cases, a grit size of the second abrasive particles is larger than a grit size of the first abrasive particles (while in other cases the relative sizes are reversed).

After the joint structure 122-3 is formed, or at least after the inner molded element 412 is formed, a sealing material 414 may be applied to exposed seams or interfaces between the inner molded element 412 and the housing members. The sealing material may be a polyurethane sealant, such as a waterborne polyurethane (e.g., a polyurethane sealant using water as a solvent). The sealing material 414 may be deposited via a needle, nozzle, spray-head, or any other suitable technique. Once hardened, dried, or otherwise cured, the sealing material 414 may form a substantially waterproof seal between the housing members and the joint structure, thereby preventing or limiting the ingress of water or other contaminants. Sealing material 414 may be applied to the seams of the other joint structures of the housing 104 as well.

Figure 5A:
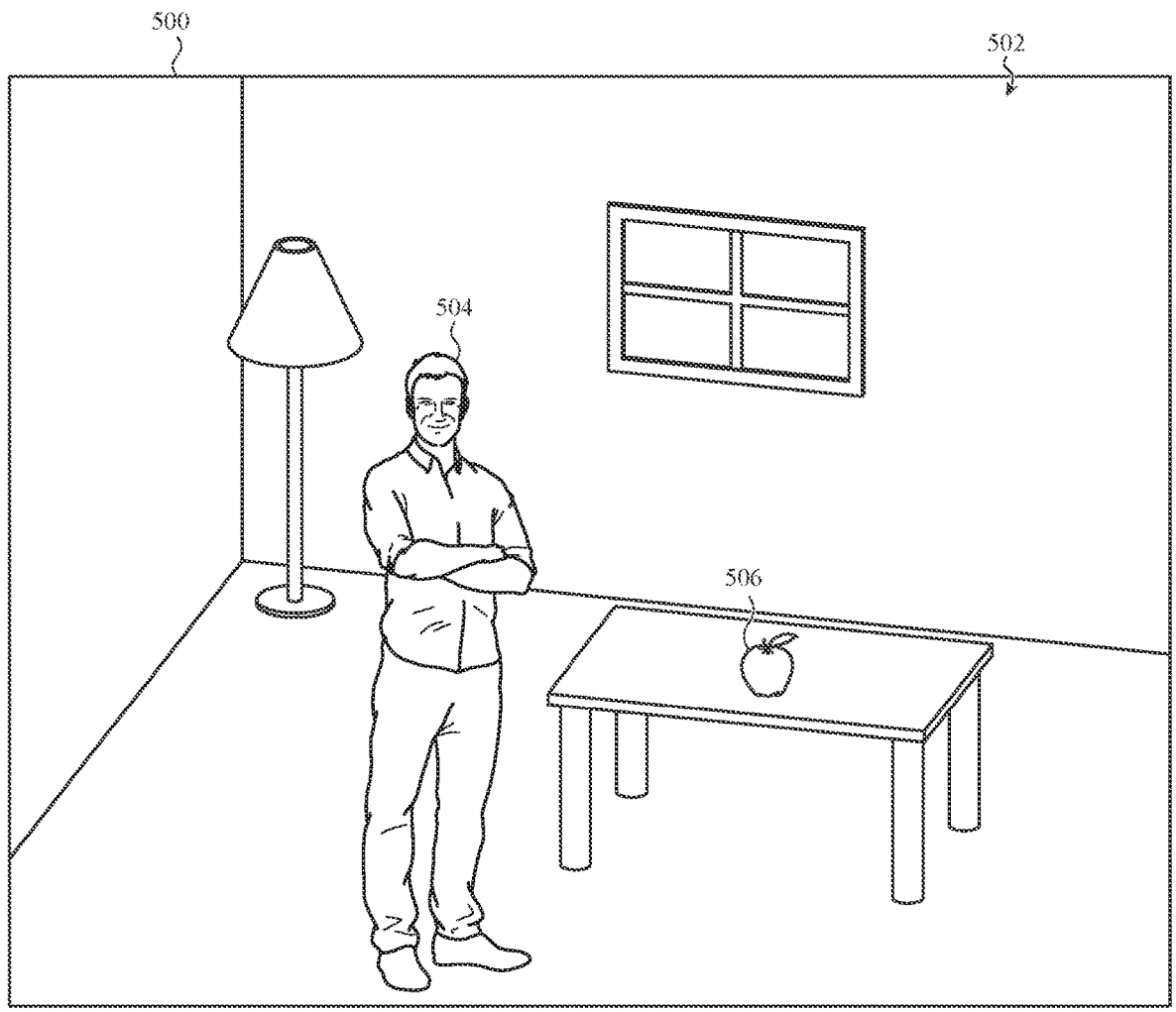
FIGS. 5A-5B depict an image captured or displayed on the device of FIGS. 1A-1B, illustrating aspects of an object detection mode.
Figure 5B:
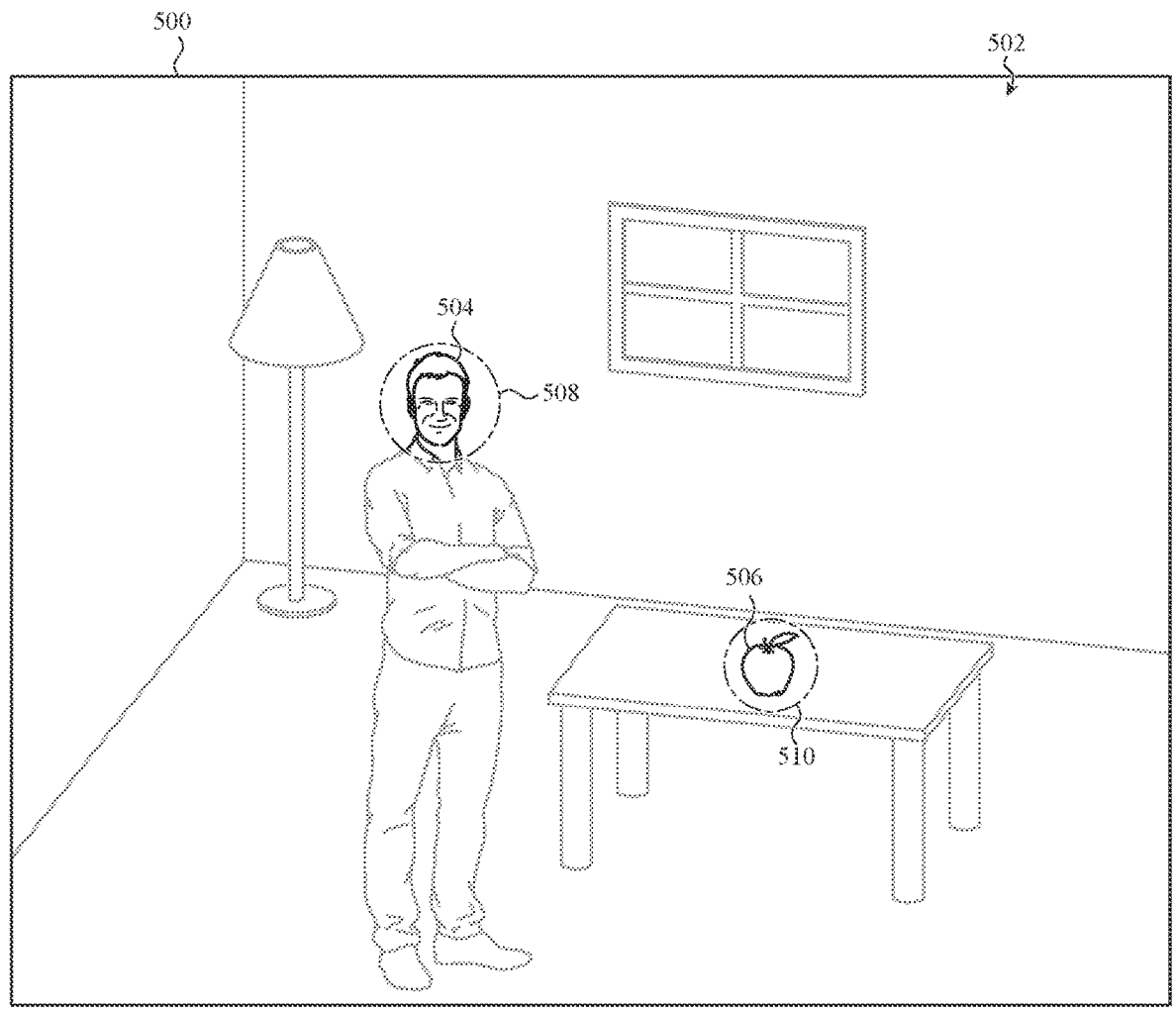

As noted above, the device 100, and in particular an image capture application of the device 100, may include object detection functionalities. Object detection may allow the user to select (or the device 100 to automatically identify) distinct objects in an image, and apply certain image effects based on the selected objects. The object detection functionality may be provided using the camera 134 with only a single lens assembly. FIGS. 5A-5B illustrate an example image to which object detection functions are applied.

FIG. 5A illustrates an image of a scene 500. The scene 500 may be captured by an image sensor of the device 100, such as using the rear-facing camera 134 or the front-facing camera 106. Further, the image may be displayed to a user on the display 103 of the device, and the user may be able to control imaging functions associated with the image by interacting with the display 103. For example, as described herein, the user may touch on an object of interest in the scene 500 (e.g., a face) to identify to the device 100 an area of the image that contains the object of interest. The device 100 may then apply certain image effects to the image based on the user selection. In some cases, the user need not select the object, as the device 100 may, without user input, select an object in the image and apply the effects to the image based on the automatic selection.

Returning to FIG. 5A, the scene may include a background 502, a person facing the camera such that his or her face 504 is visible, as well as another object 506 (in this case an Apple). As used herein, the "background" of the image may be any portion of the image that is located behind an object of interest, where the object of interest may be selected by a user and/or automatically detected by the device 100.

When the device 100 is operating in an objection detection mode, the device 100 may be configured to identify distinct objects in the image so that certain image effects can be applied differently to the identified objects as compared to background (and optionally foreground) objects. For example, the device 100 may process the image to blur, darken, or otherwise modify the background of the image, while leaving the identified objects unaffected (or while applying different effects to the identified objects). Various different image effects may be possible. For example, the device 100 may selectively blur the background while keeping the identified object in sharp focus (e.g., applying a "bokeh" effect to the background of the image). In addition to (or instead of) blurring the background, the device may also apply different lighting effects, based on a user-selectable lighting mode. For example, in a "natural light" mode, the device 100 may blur the background while making minimal or no changes to the ambient lighting of the object. In a "stage light" mode, the device 100 may darken or entirely remove the background, leaving only the identified object in the image. In a "stage light mono" mode, the device 100 may darken or entirely remove the background and also desaturate the object, leaving only a black-and-white, monochrome, or greyscale object in the image. In a "high-key light mono" mode, the device 100 may display the identified object as a grayscale subject on a white background. In a "studio light" mode, the identified object is brightly lit (e.g., the luminance or exposure or other parameter may be increased to increase the overall brightness of the object). In a "contour light" mode, the identified object has dramatic shadows with highlights and lowlights. As another example, the device 100 may desaturate (e.g., remove color) from the background of the image to produce a monochrome or black-and-white background, while leaving the identified object in color.

The objects may be selected in several ways. For example, the device 100 may select a candidate object in the image, and apply the image effects to the displayed image without additional user input. The device 100 may select the candidate object in various ways. For example, if the device 100 detects a face in the image (e.g., the face 504), the device may automatically select the face 504 as the candidate object. The device 100 may automatically detect the presence of a face using any suitable object-detection technique, such as by detecting shapes, image patterns (e.g., patterns of color, luminosity, etc.), depth information, or the like. In some cases, a predictive model (developed using machine-learning processes and suitable training data) is used to identify faces in the image.

The device 100 may also use other image information to select the candidate object, whether it is a face or another object. For example, the device 100 may consider factors such as the position of an object within the frame (e.g., if it is centered in the frame), the size of the object in the frame (e.g., the amount of space that the object occupies), the distance of the object from the camera (e.g., if it falls within a certain range of distances from the camera), or the like. The device 100 may also use boundary-detection algorithms, object-detection algorithms, depth maps, or other suitable techniques, to determine or estimate the boundaries of objects in the image. The boundaries of the object may be used to determine wherein, in the image, various image effects are to be applied. The device 100 may use factors such as the position, size, and distance of the object (as well as the estimated boundaries of the object) to select a candidate object in the image.

While the device 100 may automatically select a candidate object in the image, the user may also be able to override the selection and instead select a different face or a different object, such as by tapping on an alternate face or other object of interest. (In other cases, the device 100 does not select a candidate object, and the user must manually select an object within the image.)

Once an object is selected, the device 100 may apply one or more image effects to the image. For example, the device 100 may blur the background of the scene while maintaining the selected object in sharp focus. FIG. 5B illustrates the scene 500 after one or more objects have been selected and an image effect has been applied. As shown, the background 502 of the scene 500 has been blurred, though other types of image effects may be applied instead of or in addition to blurring the background (as described above). The blur effect may be similar to or otherwise suggestive of an out-of-focus portion of an image, and may decrease the apparent depth of field of the image. This may increase the visual distinctiveness of the selected object relative to the background.

As depicted in FIG. 5B, two objects have been detected, the person's face 504 and the apple 506. These objects may have been identified automatically by the device 100, or selected by the user (e.g., by the user tapping on the areas 508, 510, which contain the objects 504, 506, respectively). Further, while the image includes two selected objects, this is merely exemplary, and more or fewer objects may be selected in different circumstances. In some cases, the device 100 may limit the object detection and corresponding image effects to only a single object in any given scene.

While FIGS. 5A and 5B describe the object detection mode in the context of selecting the objects of interest and previewing the image, the device 100 may also capture and store the image. In some cases, the device 100 may capture and store an unaltered version of the image, and then apply one or more image effects to the stored image. In such cases, the user may be able to modify the image, including by selecting different objects of interest and/or changing the applied image effects, after the image has been captured and stored.

Figure 6:
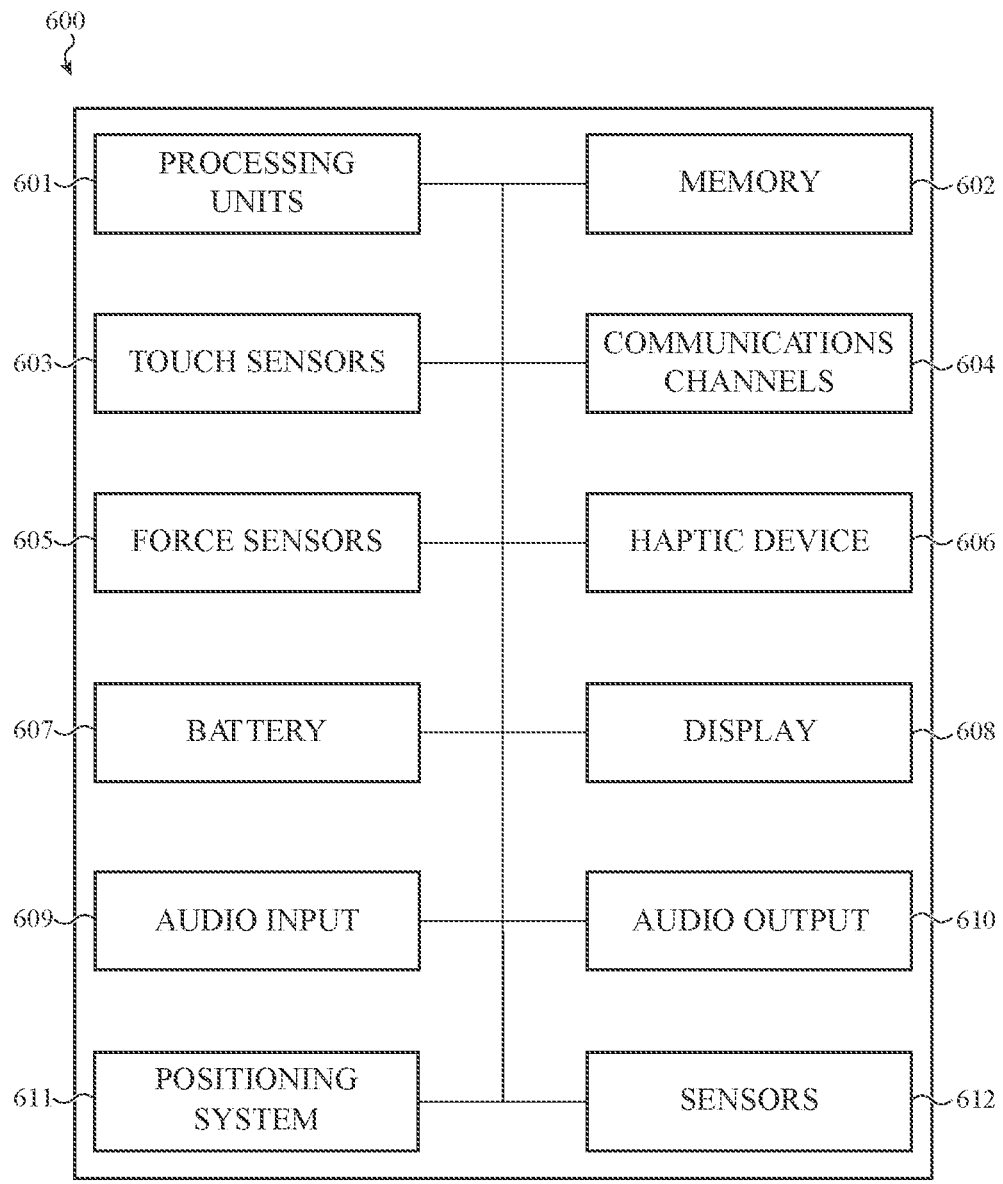
FIG. 6 depicts a schematic diagram of an example electronic device.

FIG. 6 depicts an example schematic diagram of an electronic device 600. The electronic device 600 may be an embodiment of or otherwise represent the device 100. The device 600 includes one or more processing units 601 that are configured to access a memory 602 having instructions stored thereon. The instructions or computer programs may be configured to perform one or more of the operations or functions described with respect to the electronic devices described herein. For example, the instructions may be configured to control or coordinate the operation of one or more displays 608, one or more touch sensors 603, one or more force sensors 605, one or more communication channels 604, one or more audio input systems 609, one or more audio output systems 610, one or more positioning systems 611, one or more sensors 612, and/or one or more haptic feedback devices 606.

The processing units 601 of FIG. 6 may be implemented as any electronic device capable of processing, receiving, or transmitting data or instructions. For example, the processing units 601 may include one or more of: a microprocessor, a central processing unit (CPU), an application-specific integrated circuit (ASIC), a digital signal processor (DSP), or combinations of such devices. As described herein, the term "processor" is meant to encompass a single processor or processing unit, multiple processors, multiple processing units, or other suitably configured computing element or elements. The processing units 601 may be coupled to a logic board, such as the logic board 208, FIG. 2.

The memory 602 can store electronic data that can be used by the device 600. For example, a memory can store electrical data or content such as, for example, audio and video files, images, documents and applications, device settings and user preferences, programs, instructions, timing and control signals or data for the various modules, data structures or databases, and so on. The memory 602 can be configured as any type of memory. By way of example only, the memory can be implemented as random access memory, read-only memory, Flash memory, removable memory, or other types of storage elements, or combinations of such devices. The memory 602 may be coupled to a logic board, such as the logic board 208, FIG. 2.

The touch sensors 603 may detect various types of touch-based inputs and generate signals or data that are able to be accessed using processor instructions. The touch sensors 603 may use any suitable components and may rely on any suitable phenomena to detect physical inputs. For example, the touch sensors 603 may be capacitive touch sensors, resistive touch sensors, acoustic wave sensors, or the like. The touch sensors 603 may include any suitable components for detecting touch-based inputs and generating signals or data that are able to be accessed using processor instructions, including electrodes (e.g., electrode layers), physical components (e.g., substrates, spacing layers, structural supports, compressible elements, etc.) processors, circuitry, firmware, and the like. The touch sensors 603 may be integrated with or otherwise configured to detect touch inputs applied to any portion of the device 600. For example, the touch sensors 603 may be configured to detect touch inputs applied to any portion of the device 600 that includes a display (and may be integrated with a display). The touch sensors 603 may operate in conjunction with the force sensors 605 to generate signals or data in response to touch inputs. A touch sensor or force sensor that is positioned over a display surface or otherwise integrated with a display may be referred to herein as a touch-sensitive display, force-sensitive display, or touchscreen.

The force sensors 605 may detect various types of force-based inputs and generate signals or data that are able to be accessed using processor instructions. The force sensors 605 may use any suitable components and may rely on any suitable phenomena to detect physical inputs. For example, the force sensors 605 may be strain-based sensors, piezoelectric-based sensors, piezoresistive-based sensors, capacitive sensors, resistive sensors, or the like. The force sensors 605 may include any suitable components for detecting force-based inputs and generating signals or data that are able to be accessed using processor instructions, including electrodes (e.g., electrode layers), physical components (e.g., substrates, spacing layers, structural supports, compressible elements, etc.) processors, circuitry, firmware, and the like. The force sensors 605 may be used in conjunction with various input mechanisms to detect various types of inputs. For example, the force sensors 605 may be used to detect presses or other force inputs that satisfy a force threshold (which may represent a more forceful input than is typical for a standard "touch" input) Like the touch sensors 603, the force sensors 605 may be integrated with or otherwise configured to detect force inputs applied to any portion of the device 600. For example, the force sensors 605 may be configured to detect force inputs applied to any portion of the device 600 that includes a display (and may be integrated with a display). The force sensors 605 may operate in conjunction with the touch sensors 603 to generate signals or data in response to touch- and/or force-based inputs.

The device 600 may also include one or more haptic devices 606 (e.g., the haptic actuator 214, FIG. 2). The haptic device 606 may include one or more of a variety of haptic technologies such as, but not necessarily limited to, rotational haptic devices, linear actuators, piezoelectric devices, vibration elements, and so on. In general, the haptic device 606 may be configured to provide punctuated and distinct feedback to a user of the device. More particularly, the haptic device 606 may be adapted to produce a knock or tap sensation and/or a vibration sensation. Such haptic outputs may be provided in response to detection of touch and/or force inputs, and may be imparted to a user through the exterior surface of the device 600 (e.g., via a glass or other surface that acts as a touch- and/or force-sensitive display or surface).

The one or more communication channels 604 may include one or more wireless interface(s) that are adapted to provide communication between the processing unit(s) 601 and an external device. The one or more communication channels 604 may include antennas (e.g., antennas that include or use the housing members of the housing 104 as radiating members), communications circuitry, firmware, software, or any other components or systems that facilitate wireless communications with other devices. In general, the one or more communication channels 604 may be configured to transmit and receive data and/or signals that may be interpreted by instructions executed on the processing units 601. In some cases, the external device is part of an external communication network that is configured to exchange data with wireless devices. Generally, the wireless interface may communicate via, without limitation, radio frequency, optical, acoustic, and/or magnetic signals and may be configured to operate over a wireless interface or protocol. Example wireless interfaces include radio frequency cellular interfaces, fiber optic interfaces, acoustic interfaces, Bluetooth interfaces, infrared interfaces, USB interfaces, Wi-Fi interfaces, TCP/IP interfaces, network communications interfaces, or any conventional communication interfaces. The one or more communications channels 604 may also include ultra-wideband (UWB) interfaces, which may include any appropriate communications circuitry, instructions, and number and position of suitable UWB antennas.

As shown in FIG. 6, the device 600 may include a battery 607 that is used to store and provide power to the other components of the device 600. The battery 607 may be a rechargeable power supply that is configured to provide power to the device 600. The battery 607 may be coupled to charging systems (e.g., wired and/or wireless charging systems) and/or other circuitry to control the electrical power provided to the battery 607 and to control the electrical power provided from the battery 607 to the device 600. The battery 607 may represent the battery 210, FIG. 2.

The device 600 may also include one or more displays 608 configured to display graphical outputs. The displays 608 may use any suitable display technology, including liquid crystal displays (LCD), organic light emitting diodes (OLED), active-matrix organic light-emitting diode displays (AMOLED), or the like. The displays 608 may display graphical user interfaces, images, icons, or any other suitable graphical outputs. The display 608 may represent the display stack 302, FIGS. 3A-3F.

The device 600 may also provide audio input functionality via one or more audio input systems 609. The audio input systems 609 may include microphones, transducers, or other devices that capture sound for voice calls, video calls, audio recordings, video recordings, voice commands, and the like.

The device 600 may also provide audio output functionality via one or more audio output systems (e.g., speakers) 610, such as the speaker system 216 (FIG. 2). The audio output systems 610 may produce sound from voice calls, video calls, streaming or local audio content, streaming or local video content, or the like.

The device 600 may also include a positioning system 611. The positioning system 611 may be configured to determine the location of the device 600. For example, the positioning system 611 may include magnetometers, gyroscopes, accelerometers, optical sensors, cameras, global positioning system (GPS) receivers, inertial positioning systems, or the like. The positioning system 611 may be used to determine spatial parameters of the device 600, such as the location of the device 600 (e.g., geographical coordinates of the device), measurements or estimates of physical movement of the device 600, an orientation of the device 600, or the like.

The device 600 may also include one or more additional sensors 612 to receive inputs (e.g., from a user or another computer, device, system, network, etc.) or to detect any suitable property or parameter of the device, the environment surrounding the device, people or things interacting with the device (or nearby the device), or the like. For example, a device may include temperature sensors, biometric sensors (e.g., fingerprint sensors, photoplethysmographs, blood-oxygen sensors, blood sugar sensors, or the like), eye-tracking sensors, retinal scanners, humidity sensors, buttons, switches, lid-closure sensors, or the like.

To the extent that multiple functionalities, operations, and structures described with reference to FIG. 6 are disclosed as being part of, incorporated into, or performed by the device 600, it should be understood that various embodiments may omit any or all such described functionalities, operations, and structures. Thus, different embodiments of the device 600 may have some, none, or all of the various capabilities, apparatuses, physical features, modes, and operating parameters discussed herein. Further, the systems included in the device 600 are not exclusive, and the device 600 may include alternative or additional systems, components, modules, programs, instructions, or the like, that may be necessary or useful to perform the functions described herein.

What is claimed is:

1. A mobile phone comprising:
   a housing defining at least a portion of a back exterior surface of the mobile phone;
   a display stack at least partially within the housing, the display stack defining an active region configured to produce a graphical output;
   a transparent cover positioned over the display stack and defining:
   a first portion covering the active region of the display stack;
   a second portion adjacent the first portion; and
   a hole in the second portion and extending through the transparent cover;
   a button element positioned in the hole of the transparent cover;
   a force-sensing system configured to detect an input applied to the button element;
   a circuit board coupled to the force-sensing system and positioned below the second portion of the transparent cover and having a first thickness; and
   a shim positioned below the first portion of the transparent cover and having a second thickness that is the same as the first thickness.

2. The mobile phone of claim 1, wherein:
   the shim defines:
   a first top surface; and
   a first bottom surface opposite the first top surface;
   the circuit board defines:
   a second top surface; and
   a second bottom surface opposite the second top surface; and
   the first top surface is coplanar with the second top surface.

3. The mobile phone of claim 2, wherein the first top surface and the second top surface are both coupled to a bottom surface of the display stack.

4. The mobile phone of claim 3, wherein:
   the shim defines a first side surface extending from the first top surface to the first bottom surface;
   the circuit board defines a second side surface extending from the second top surface to the second bottom surface; and
   the first side surface is adjacent to the second side surface.

5. The mobile phone of claim 3, wherein the first bottom surface and the second bottom surface are both in contact with an upper surface of a component positioned below the circuit board and the shim.

6. The mobile phone of claim 5, wherein the component is a metal frame member.

7. The mobile phone of claim 1, wherein:
   the circuit board comprises a first dielectric material;
   the shim comprises a second dielectric material; and
   the first and second dielectric materials are a same dielectric material.

8. A mobile phone comprising:
   a housing defining at least a portion of a back exterior surface of the mobile phone;
   a display stack at least partially within the housing;
   a transparent cover covering the display stack and defining:
   a display region of the mobile phone;
   a border region along a side of the display region; and
   a hole in the border region and extending through the transparent cover;
   a button element positioned in the hole of the transparent cover; and
   a circuit board positioned below the border region of the transparent cover and defining:
   a first top surface in contact with a first component of the mobile phone; and
   a first bottom surface in contact with a second component of the mobile phone; and
   a shim positioned below the display region of the transparent cover and defining:
   a second top surface in contact with the first component of the mobile phone; and
   a second bottom surface in contact with the second component of the mobile phone.

9. The mobile phone of claim 8, wherein the first component of the mobile phone is a component of the display stack.

10. The mobile phone of claim 9, wherein the second component of the mobile phone is a metal frame member.

11. The mobile phone of claim 8, wherein the shim has a same thickness as the circuit board.

12. The mobile phone of claim 8, wherein:
the mobile phone further comprises a force sensing system configured to detect an input applied to the button element; and
the circuit board conductively couples the force sensing system to a processor of the mobile phone.

13. The mobile phone of claim 8, wherein:
the circuit board comprises a set of conductive traces; and
the shim comprises a dielectric material that is substantially free of conductive traces.

14. The mobile phone of claim 8, wherein the circuit board and the shim both comprise a flexible polymer material.

15. A handheld electronic device comprising:
a housing defining at least a portion of a back exterior surface of the handheld electronic device;
a display stack within the handheld electronic device;
a transparent cover covering the display stack and defining a hole extending through the transparent cover;
a button element positioned in the hole of the transparent cover;
a frame member positioned below the display stack;
a circuit board positioned below the hole and defining a first top surface coupled to the display stack and a first bottom surface coupled to the frame member; and
a shim defining a second top surface coupled to the display stack and a second bottom surface coupled to the frame member.

16. The handheld electronic device of claim 15, wherein the shim has a same thickness as the circuit board.

17. The handheld electronic device of claim 15, wherein the shim is conductively isolated from electrical components of the handheld electronic device.

18. The handheld electronic device of claim 15, wherein the frame member comprises a metal.

19. The handheld electronic device of claim 15, wherein:
the handheld electronic device further comprises a force sensing system configured to detect an input applied to the button element; and
the circuit board conductively couples the force sensing system to a processor of the handheld electronic device.

20. The handheld electronic device of claim 19, wherein:
the circuit board comprises a flexible substrate; and
the shim is formed from a polyethylene terephthalate.

* * * * *